(12) United States Patent
Fujimori et al.

(10) Patent No.: US 7,879,713 B2
(45) Date of Patent: Feb. 1, 2011

(54) MOUNTING METHOD OF SEMICONDUCTOR ELEMENT USING OUTSIDE CONNECTION PROJECTION ELECTYRODE AND MANUFACTURING METHOD OF SEMICONDUCTOR DEVICE USING OUTSIDE CONNECTION PROJECTION ELECTRODE

(75) Inventors: Joji Fujimori, Kawasaki (JP); Seiki Sakuyama, Kawasaki (JP); Toshiya Akamatsu, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 600 days.

(21) Appl. No.: 11/653,954

(22) Filed: Jan. 17, 2007

(65) Prior Publication Data
US 2008/0124834 A1 May 29, 2008

(30) Foreign Application Priority Data
Aug. 18, 2006 (JP) .............................. 2006-223280

(51) Int. Cl.
*H01L 21/44* (2006.01)
(52) U.S. Cl. ................... 438/612; 438/613; 438/614; 438/615; 438/618; 438/622; 257/779; 257/790; 257/782
(58) Field of Classification Search ................ 438/612, 438/613, 614, 615, 618, 622; 257/779, 780, 257/782
See application file for complete search history.

(56) References Cited

U.S. PATENT DOCUMENTS 4,922,377 A * 5/1990 Matsumoto et al. ......... 361/705
5,281,151 A * 1/1994 Arima et al. ................... 439/68
6,672,500 B2 * 1/2004 Caletka et al. ............... 228/103
6,805,974 B2 * 10/2004 Choi et al. ................... 428/646
7,352,069 B2   4/2008 Hazeyama et al.
2003/0156969 A1   8/2003 Choi et al.
2004/0222522 A1  11/2004 Homma

FOREIGN PATENT DOCUMENTS

| CN | 1531076 A | 9/2004 |
|---|---|---|
| CN | 1633513 A | 6/2005 |
| CN | 1732562 | 2/2006 |
| JP | 11-354919 A | 12/1999 |
| JP | 2001-111898 A | 4/2001 |
| WO | WO 2004/047167 | 6/2004 |

OTHER PUBLICATIONS

Chinese Office Action dated Mar. 13, 2009, issued in corresponding Chinese Patent Application No. 200710008067X.
"Chinese Office Action", mailed by Chinese Patent Office and corresponding to Chinese application No. 200910141837.7 on Mar. 29, 2010, with English translation.
"Taiwanese Office Action," mailed Dec. 17, 2009, in corresponding Taiwanese Patent Application No. 096101591, Partial English Translation.

* cited by examiner

*Primary Examiner*—Thanh V Pham
(74) *Attorney, Agent, or Firm*—Fujitsu Patent Center

(57) ABSTRACT

A mounting method of a semiconductor element whereby the semiconductor element is mounted on a wiring board via an outside connection projection electrode not containing lead (Pb), the mounting method includes a step of applying a reflow heating process for connecting the outside connection projection electrode of the semiconductor element and the wiring board and then cooling the connected semiconductor element and wiring board at a cooling rate equal to and lower than 0.5° C./s.

6 Claims, 4 Drawing Sheets

MOUNTING METHOD OF SEMICONDUCTOR ELEMENT USING OUTSIDE CONNECTION PROJECTION ELECTYRODE AND MANUFACTURING METHOD OF SEMICONDUCTOR DEVICE USING OUTSIDE CONNECTION PROJECTION ELECTRODE

BACKGROUND OF THE INVENTION

1. Field of the Invention

The present invention generally relates to mounting methods of semiconductor elements and manufacturing methods of semiconductor devices, and more specifically, to a mounting method of a semiconductor element wherein the semiconductor element is mounted on a wiring board via an outside connection projection electrode not containing lead (Pb) and a manufacturing method of a semiconductor device.

2. Description of the Related Art

Conventionally and continuing to the present, a semiconductor device having a structure where a semiconductor element is flip chip mounted on a wiring board in a face-down manner via an outside connection projection electrode not containing lead (Pb), called a lead-free solder bump, is known.

FIG. 1 is a cross-sectional view showing a structure of a semiconductor element applied to such a semiconductor device. FIG. 2 is an enlarged view of a part surrounded by a dotted line in FIG. 1.

Referring to FIG. 1 and FIG. 2, for manufacturing the semiconductor element, a so-called wafer process is applied to a semiconductor substrate 1 made of silicon (Si). An active element such as a transistor or a passive element such as a capacitor (not shown) is formed on a main surface of the semiconductor substrate 1. In addition, a multilayer interconnection layer 3 is provided on another main surface of the semiconductor substrate 1 via an insulation layer such as a silicon oxide ($SiO_2$) layer 2.

As shown in FIG. 2, such a multilayer interconnection layer 3 is formed by stacking plural wiring layers 4 made of aluminum (Al) or copper (Cu) via interlayer isolation films 5. Upper and lower wiring layers 4 are connected by an interlayer connection part.

As a material of the interlayer isolation film 5, so-called Low-K material, namely a material having a low dielectric constant, such as FSG (Fluorine Doped Silicon Glass) that is silicon glass doped with fluoride, SiOC that is silicon oxide where carbon is added, or an organic resin is used, so that the electric capacitance formed in wirings is reduced and the transferring speed of an electric signal is made high.

Functional elements such as the active elements or the passive elements formed on the semiconductor substrate 1 are connected to each other via the multilayer interconnection layer 3, so that an electronic circuit that performs a desirable function is formed.

Plural electrode pads 11 made of aluminum (Al) are selectively provided on upper parts of the multilayer interconnection layer 3 so as to be connected to the wiring 4 forming the multilayer interconnection layer 3.

A passivation layer 6 is selectively provided on the multilayer interconnection layer 3. The passivation layer 6 is made of an inorganic insulation material such as silicon oxide ($SiO_2$) or silicon nitride (SiN). Openings are selectively formed in the passivation layer 6 so that center parts of the electrode pads 11 are exposed.

In addition, in order to protect a surface of the semiconductor element, an organic insulation film 7 is provided so as to cover an upper surface of the inorganic insulation layer 6 and an edge surface of the inorganic insulation layer 6 on the electrode pad 11.

A material of the organic insulation film 7 is selected from organic insulation material such as polyimide, BCB (Benzo-Cyclo-Butene), phenolic resin or polybenzoxazole.

A UBM (Under Bump Metallization) 8 made of, for example, titanium (Ti)/copper (Cu) is provided on an upper surface of the electrode pad 11. The UBM 8 is provided in a vertical direction from a part of the upper surface of the electrode pad 11 where the inorganic insulation layer 6 and the organic insulation film 7 are not provided to a position slightly above the upper surface of the organic insulation film 7. The UBM 8 covers an end surface of the organic insulation film 7.

Outside connection projection electrodes 9 having substantially spherical shape configurations are provided on the upper surface of the UBM 8. The outside connection projection electrode 9, called a solder bump, is made of a solder not containing lead (Pb) such as tin (Sn)—silver (Ag) or tin (Sn)—silver (Ag) including copper (Cu).

FIG. 3 is a cross-sectional view showing a state where the semiconductor element 10 shown in FIG. 1 is flip chip mounted on a wiring board. Referring to FIG. 3, the semiconductor element 10 is flip chip mounted face down on a wiring board 20.

The wiring board 20 is an organic buildup board made of, for example, glass epoxy material or polyimide tape. On an upper surface of the wiring board 20, plural electrode pads 21 are selectively provided and solder resist 22 is provided with selective openings so that center parts of the electrode pads 21 are exposed.

The outside connection projection electrodes 9 are connected to the electrode pads 21 provided on the wiring board 20. In addition, so-called underfill material 23 is provided between the semiconductor element 10 and the wiring board 20. Plural outside connection projection electrodes 24 made of solder are provided on a lower surface of the wiring board 20.

The semiconductor device having such a structure is manufactured by the following steps.

First, the semiconductor element 10 is flip chip mounted on the wiring board 20 in the face down manner.

Then, by a reflow heating process, the outside connection projection terminals 9 and preliminary solder (solder pre-coat) provided on the electrode pads 21 of the wiring board 20 in advance are made molten so that the outside connection projection terminals 9 of the semiconductor element 10 and the wiring board 20 are connected. The preliminary solder does not contain lead (Pb).

After that, the underfill material 23 is supplied between the semiconductor element 10 and the wiring board 20 and then cured.

Last, solder balls are provided on a lower surface of the wiring board 20 so that outside connection projection electrodes 24 are connected via a reflow heating process and a cooling process.

In the meantime, Japanese Laid-Open Patent Application Publication No. 2006-111898 discloses an electronic component having the following structure. That is, a tin-plated film on a base metal is subjected to oxidation or hydration treatment at room temperature, and a surface layer of an oxide or a hydroxide is formed on the surface of the tin-plated film so that the surface layer is dense and uniform, and suppresses the growth of tin whiskers.

Furthermore, Japanese Laid-Open Patent Application Publication No. 11-354919 discloses a manufacturing method of an electronic circuit board wherein an electronic component and the circuit board are connected by using lead (Pb) free solder including bismuth (Bi). In this method, the solder is cooled at a cooling speed of approximately 10-20° C./s so that the electronic component and the circuit board are connected.

In addition, International Patent Publication No. 2004/047167 discloses a semiconductor device wherein a through-electrode is formed in a wiring board so as to electrically connect a wiring layer formed on a wiring layer formation surface of a base substrate of the wiring board where a semiconductor chip is flip chip mounted and an electrode formed on a chip mounting surface; and the thermal expansion coefficient of the base substrate is equal to the thermal expansion coefficient of the semiconductor chip, or less than the thermal expansion coefficient of the wiring layer.

As discussed above, in manufacturing the semiconductor device wherein the semiconductor element 10 is flip chip mounted on the wiring board 20 via the outside connection projection electrode 9 not containing lead (Pb), by the reflow heating process, the outside connection projection terminals 9 and the preliminary solder (solder pre-coat) not containing lead (Pb) and provided on the electrode pads 21 of the wiring board 20 in advance are made molten, so that the outside connection projection terminals 9 of the semiconductor element 10 and the wiring board 20 are connected. After that, the outside connection projection terminals 9 and the preliminary solder are cooled so as to be made solid.

The coefficient of thermal expansion of a silicon substrate of the semiconductor element 10 is approximately 3 through 4 ppm/° C. On the other hand, the coefficient of thermal expansion of the wiring board 20 made of an organic material board is approximately 10 through 17 ppm/° C. Thus, the coefficient of thermal expansion of the wiring board 20 is greater than the coefficient of thermal expansion of the semiconductor element 10.

In addition, the outside connection projection terminals 9 and the preliminary solder are made of solder not containing lead (Pb). If the outside connection projection terminals 9 and the preliminary solder are made of, for example, solder formed by tin (Sn)—silver (Ag) or solder formed by tin (Sn)—silver (Ag)—copper (Cu), the melting point of the solder is approximately 217 through 220° C.

Therefore, in a state where the solder is heated to a temperature higher than the melting point such as 250° C., the solder is melted so as to follow deformation due to thermal expansion of the semiconductor element 10 and the wiring board 20.

In the reflow heating process, the wiring board 20 where the semiconductor elements 10 are provided is moved into a reflow processing apparatus where plural heating areas (blocks) have heaters are arranged in a line, so as to be processed. The temperature of the heaters in every heating area in the reflow processing apparatus is controlled so that the heating process and temperature decreasing process, namely cooling process, are performed.

FIG. 4 is a graph showing temperature change of the semiconductor device shown in FIG. 3 in a reflow heating process for connecting the outside connection projection electrodes 9 of the semiconductor element 10 and the wiring board 20 and a cooling process at a cooling rate of approximately 0.7° C./s after the reflow heating process. The horizontal axis of this graph indicates time (sec) and the vertical axis of this graph indicates temperature (° C.).

In other words, in the reflow heating process, a temperature of approximately 150° C. is maintained for a designated time. Flux is activated and oxide films on surfaces of the outside connection projection terminals 9 and the preliminary solder are removed. After that, heating is applied until the temperature is greater than the melting point of the solder, such as 250° C.

After the solder is molten, heating is stopped or the temperature is decreased to be equal to or lower than the melting point of the solder (217 through 220° C.) and thereby the solder is made solid. After the solder is solidified, cooling is gradually applied from the melting point of the solder to a temperature near normal room temperature.

In the related art, for efficiency of manufacturing steps, approximately 0.7° C./s is applied as a cooling rate. As discussed above, the melting point of the solder not containing lead (Pb) is higher than the melting point of the solder containing lead (Pb). Therefore, for efficient cooling to a temperature near normal temperature, the cooling rate of approximately 0.7° C./s is applied in the related art.

However, if the semiconductor device is cooled at the cooling rate of approximately 0.7° C./s, based on difference of coefficients of thermal expansion between the semiconductor element 10 and the wiring board 20, strain/stress is remarkably generated. In other words, since the coefficient of thermal expansion of the wiring board 20 is greater than the coefficient of thermal expansion of the semiconductor element 10, stress is applied from the wiring board 20 having greater expansion and contraction due to the temperature change to the semiconductor element 10 at the time of the cooling process.

Since such a state is generated when the solder (the outside connection projection terminals 9 and the preliminary solder) is solid, it is not possible for the solder to absorb the stress applied from the wiring board 20 to the semiconductor element 10. Therefore, the stress applied from the wiring board 20 to the semiconductor element 10 may be applied to the interlayer insulation film 5 made of the Low-K material of the multilayer wiring layer 3.

As a result of this, delamination of the wiring layers 4 stacked on each other via the interlayer insulation films 5 may be generated so that electrical defects may occur in the semiconductor device.

SUMMARY OF THE INVENTION

Accordingly, embodiments of the present invention may provide a novel and useful mounting method of a semiconductor element and manufacturing method of a semiconductor device solving one or more of the problems discussed above.

More specifically, the embodiments of the present invention may provide a mounting method of a semiconductor element and a manufacturing method of a semiconductor device whereby, when the semiconductor element is mounted on a wiring board via an outside connection projection terminal not containing lead (Pb), a stress applied from the wiring board to a multilayer wiring part of the semiconductor element including an interlayer insulation film formed by a Low-K material can be eased, so that delamination can be prevented and manufacturing yield of the semiconductor device can be improved.

One aspect of the present invention may be to provide a mounting method of a semiconductor element whereby the semiconductor element is mounted on a wiring board via an outside connection projection electrode not containing lead (Pb), the mounting method including a step of applying a reflow heating process for connecting the outside connection projection electrode of the semiconductor element and the wiring board and then cooling the connected semiconductor element and wiring board at a cooling rate equal to and lower than 0.5° C./s.

Another aspect of the present invention may be to provide a mounting method of a semiconductor element whereby the semiconductor element is mounted on a wiring board via an outside connection projection electrode, the mounting method including a step of applying a reflow heating process for connecting the outside connection projection electrode of the semiconductor element and the wiring board and then applying a step-cooling process; wherein, in the step-cooling process, the connected semiconductor element and the wiring board are cooled so that temperature is decreased; after the temperature reaches a designated temperature, the designated temperature is maintained for a designated time; after the designated time passes, the semiconductor element and the wiring board are cooled again so that temperature is further decreased. In the above-mentioned mounting method of the semiconductor element, the step-cooling process may be repeated one or more times. The designated temperature may be equal to or greater than approximately 80° C. and equal to or lower than approximately 150° C. The designated time may be equal to or greater than 120 seconds.

Other aspect of the present invention may be to provide a manufacturing method of a semiconductor device, including a step of applying a reflow heating process for connecting a wiring board and an outside connection projection electrode not containing lead (Pb) of a semiconductor element, and then cooling the semiconductor element and wiring board at a cooling rate equal to and lower than 0.5° C./s.

Other aspect of the present invention may be to provide a manufacturing method of a semiconductor device, including a step of applying a reflow heating process for connecting an outside connection projection electrode of a semiconductor element and a wiring board and then applying a step-cooling process; wherein, in the step-cooling process, the connected semiconductor element and the wiring board are cooled so that temperature is decreased; after the temperature reaches a designated temperature, the designated temperature is maintained for a designated time; after the designated time passes, the semiconductor element and the wiring board are cooled again so that the temperature is further decreased.

According to the above-mentioned mounting method of the semiconductor element or the above-mentioned manufacturing method of the semiconductor device, when the semiconductor element is mounted on a wiring board via an outside connection projection terminal not containing lead (Pb), a stress applied from the wiring board to a multilayer wiring part of the semiconductor element including an interlayer insulation film formed by a Low-K material can be eased, so that delamination can be prevented and manufacturing yield of the semiconductor device can be improved.

Other objects, features, and advantages of the present invention will be come more apparent from the following detailed description when read in conjunction with the accompanying drawings.

DETAILED DESCRIPTION OF THE PREFERED EMBODIMENTS

Figure 1:
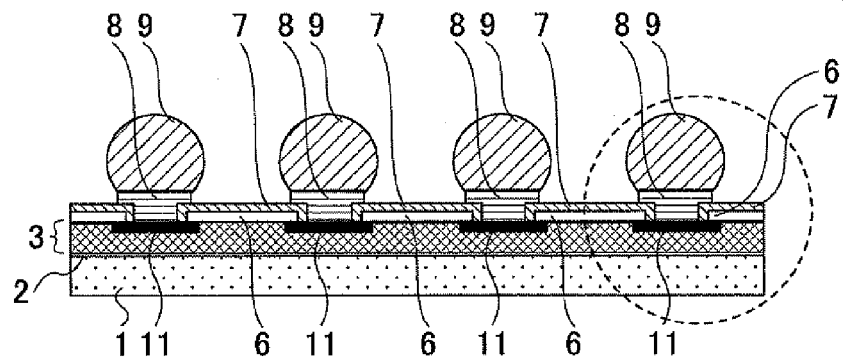
FIG. 1 is a cross-sectional view showing a structure of a semiconductor element.

A description is given below, with reference to the FIG. 5 through FIG. 8 of embodiments of the present invention.

The embodiments of the present invention are regarding a reflow heating process and a cooling process after the reflow heating process. Here, the reflow heating process is applied, in the method discussed with reference to FIG. 1 through FIG. 3 whereby the semiconductor element 10 is flip chip mounted on the wiring board 20 via the outside connection projection electrode 9 made of so-called lead (Pb) free solder not containing lead (Pb), in order to connect the outside connection projection electrode 9 of the semiconductor element 10 and the wiring board 20 after the semiconductor element 10 is flip chip mounted on the wiring board 20.

More specifically, after the outside connection projection electrode 9 and the preliminary solder (pre-coat of solder, not shown) not containing lead (Pb) and provided on the electrode pad 21 of the wring board 20 in advance are melted by a reflow heating process so as to be connected to each other, when the solder is cooled and made solid and the semiconductor device is cooled to near normal temperature, the first embodiment or the second embodiment of the present invention is applied as a method for cooling.

By such a method, even if the solder is made solid by the cooling process after the reflow heating process and the semiconductor device is cooled to near normal temperature, stress generated based on the difference between the coefficients of thermal expansion of the semiconductor elements 10 and the wiring board 20, namely stress applied from the wiring board 20 to the multilayer wiring layer 3 of the semiconductor element 10, is prevented from being generated so that delamination of the multilayer wiring layer 3 does not occur.

Figure 2:
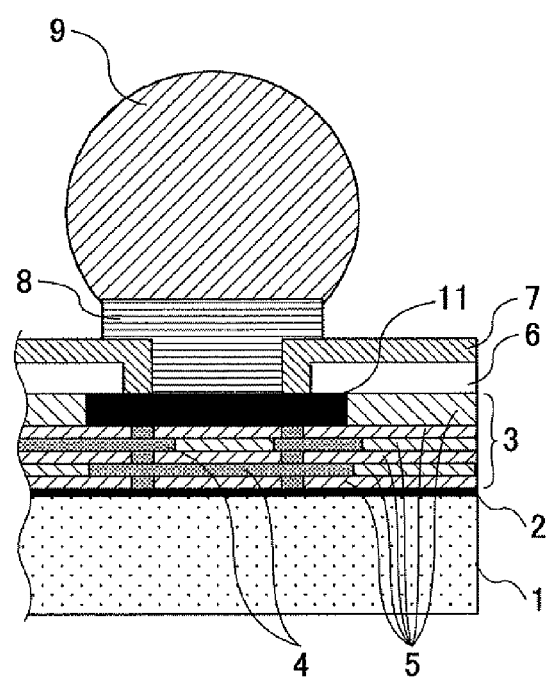
FIG. 2 is an enlarged view of a part surrounding by a dotted line in FIG. 1.

In the following explanation, since the structures of the semiconductor element 10 and the wiring board 20 are the same as those discussed with reference to FIG. 1 through FIG. 3, explanation thereof is omitted.

Inventors of the present invention found that it is possible to solve the above-discussed problems by gradually reducing the cooling rate, namely gradually delaying a time when the temperature reaches a designated cooling temperature.

First Embodiment of the Present Invention

In the first embodiment of the present invention, a cooling process is implemented by setting the gradually cooling rate to approximately 0.5° C./s that is slower than that of the related art, namely approximately 0.7° C./s.

Figure 3:
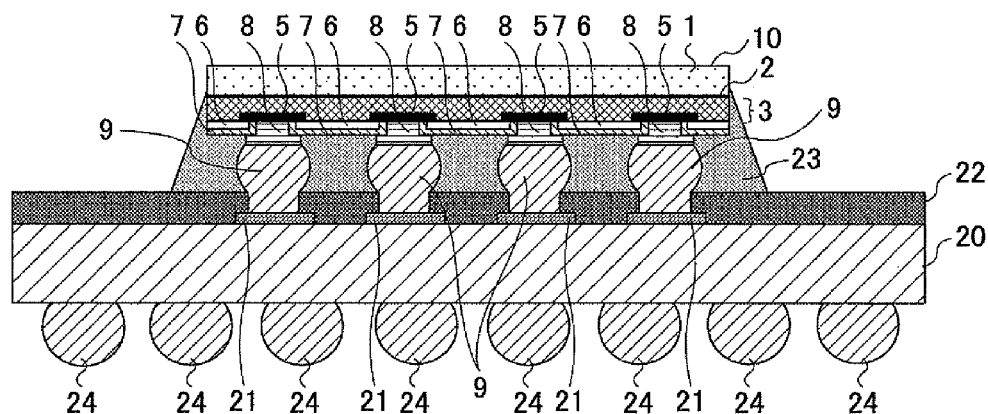
FIG. 3 is a cross-sectional view showing a state where the semiconductor element shown in FIG. 1 is flip chip mounted on a wiring board.
Figure 4:
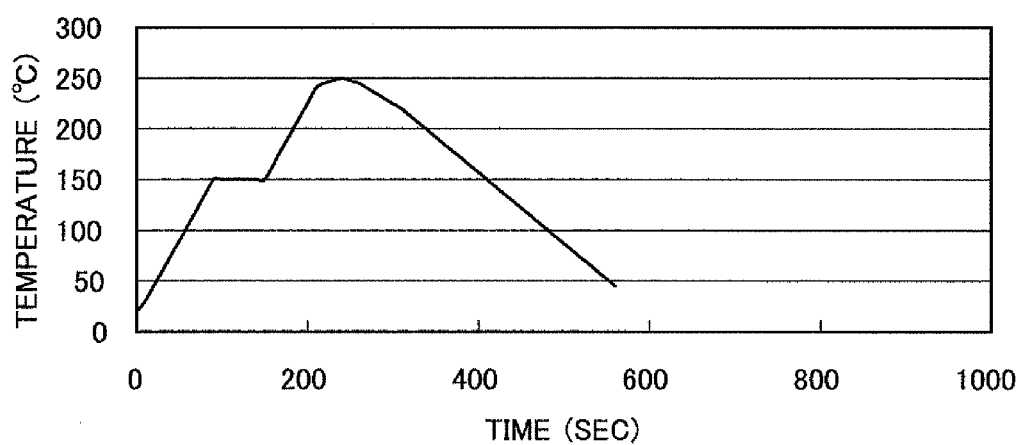
FIG. 4 is a graph showing temperature change of the semiconductor device shown in FIG. 3 in a reflow heating process and a cooling process at a cooling rate of approximately 0.7° C./s after the reflow heating process.
Figure 5:
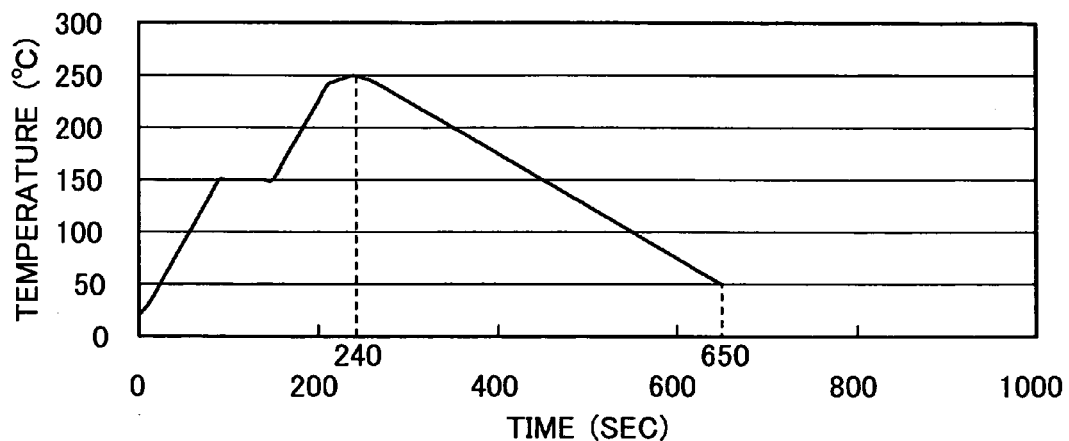
FIG. 5 is a graph showing temperature change of the semiconductor device shown in FIG. 3 in a reflow heating process and a cooling process at a cooling rate of approximately 0.5° C./s after the reflow heating process.

FIG. 5 is a graph showing temperature change of the semiconductor device shown in FIG. 3 in a reflow heating process for connecting the outside connection projection electrode 9 of the semiconductor element 10 and the wiring board 20, and a cooling process at a cooling rate of approximately 0.5° C./s after the reflow heating process. The horizontal axis of this graph indicates time (sec) and the vertical axis of this graph indicates temperature (° C.).

In other words, in the reflow heating process, the temperature of approximately 150° C. is maintained for a designated time. Flux is activated and oxide films on surfaces of the outside connection projection terminals 9 and the preliminary solder are removed. After that, heating is applied until the temperature is greater than the melting point of the solder, such as 250° C.

When approximately 240 seconds pass after the reflow heating process starts, the temperature reaches approximately 250° C. At this time, the solder is molten. After the solder is molten, heating is stopped and the temperature is decreased to be equal to or lower than the melting point of the solder (217 through 220° C.) and thereby the solder is made solid. After the solder is solidified, cooling is gradually applied from the melting point of the solder to a temperature near normal temperature.

In the first embodiment of the present invention approximately 0.5° C./s is applied as the cooling rate.

As a result of this, as shown in FIG. 5, when approximately 650 seconds pass after the reflow heating process starts, the temperature reaches approximately 50° C.

After the temperature reaches approximately 50° C., the semiconductor element 10 connected to the wiring board 20 is taken outside of the reflow processing apparatus so as to be self-cooled (naturally cooled).

After that, the underfill material 23 is supplied between the semiconductor element 10 and the wiring board 20 and then cured. Last, solder balls are provided on a lower surface of the wiring board 20 so that outside connection projection electrodes 24 are connected.

Second Embodiment of the Present Invention

In the second embodiment of the present invention, a cooling process is implemented by setting the gradually cooling rate to approximately 0.3° C./s that is slower than that of the related art, namely approximately 0.7° C./s.

Figure 6:
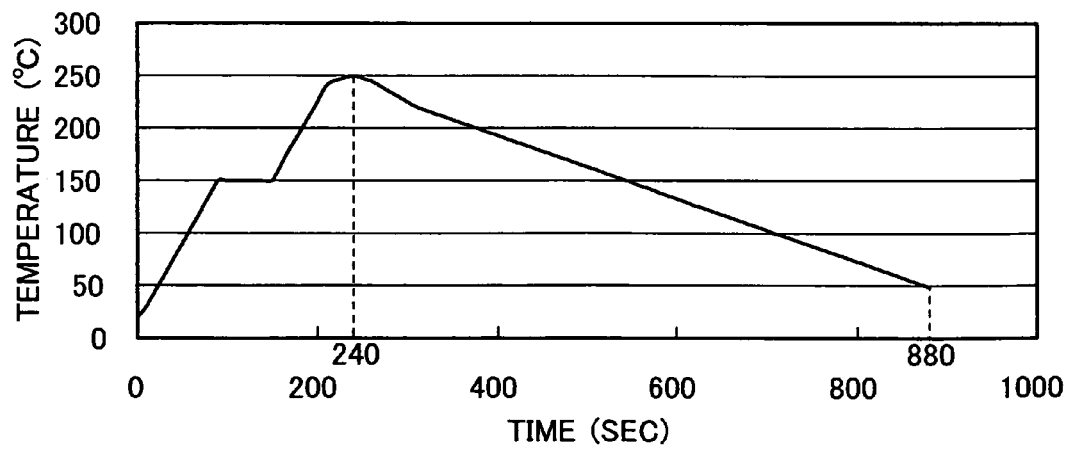
FIG. 6 is a graph showing temperature change of the semiconductor device shown in FIG. 3 in a reflow heating process and a cooling process at a cooling rate of approximately 0.3° C./s after the reflow heating process.

FIG. 6 is a graph showing temperature change of the semiconductor device shown in FIG. 3 in a reflow heating process for connecting the outside connection projection electrode 9 of the semiconductor element 10 and the wiring board 20, and a cooling process at a cooling rate of approximately 0.3° C./s after the reflow heating process. The horizontal axis of this graph indicates time (sec) and the vertical axis of this graph indicates temperature (° C.).

In other words, in the reflow heating process, a temperature of approximately 150° C. is maintained for a designated time. Flux is activated and oxide films on surfaces of the outside connection projection terminals 9 and the preliminary solder are removed. After that, heating is applied until the temperature is greater than the melting point of the solder, such as 250° C.

When approximately 240 seconds pass after the reflow heating process starts, the temperature reaches approximately 250° C. At this time, the solder is molten. After the solder is molten, heating is stopped and the temperature is decreased to be equal to or lower than the melting point of the solder (217 through 220° C.), and thereby the solder is made solid. After the solder is solidified, cooling is gradually applied from the melting point of the solder to a temperature near normal temperature.

In the second embodiment of the present invention approximately 0.3° C./s is applied as the cooling rate.

As a result of this, as shown in FIG. 6, when approximately 880 seconds pass after the reflow heating process starts, the temperature reaches approximately 50° C.

After the temperature reaches approximately 50° C., the semiconductor element 10 connected to the wiring board 20 is taken outside of the reflow processing apparatus so as to be self-cooled (naturally cooled).

After that, the underfill material 23 is supplied between the semiconductor element 10 and the wiring board 20 and then cured. Last, solder balls are provided on a lower surface of the wiring board 20 so that outside connection projection electrodes 24 are connected.

The inventors of the present invention checked the multilayer wiring layer 3 of the semiconductor element 10 of the semiconductor device manufactured by the above-discussed embodiments of the present invention. The inventors found that there is no delamination at the wiring layers 4 stacked via the interlayer insulation films 5 made of the Low-K material.

The inventors also performed temperature shock test of 100 cycles as an environmental test, a moisture absorption test, and reflow tests three times under conditions defined by JEDEC (Joint Electron Device Engineering Council)-Level 3. As a result of this, it was found by the inventors that destruction such as delamination due to application of the stress to the wiring layers 4 stacked via the interlayer insulation films made of the Low-K material did not occur.

Thus, by setting the cooling rate to approximately 0.5° C./s or 0.3° C./s that is slower than that of the related art, namely approximately 0.7° C./s, it is possible to prevent generation of the stress applied from the wiring board 20 to the semiconductor element 10 based on contraction or deformation of the semiconductor element 10 and the wiring board 20 accompanying cooling.

Therefore, stress applied from the wiring board 20 to the wiring layers 4 stacked via the interlayer insulation films 5 made of the Low-K material of the semiconductor element 10 is eased so that destruction such as the delamination can be prevented.

Third Embodiment of the Present Invention

In the above-discussed first and second embodiments of the present invention, in the cooling press after the reflow heating process, by decreasing the cooling rate, stress applied from the wiring board 20 to the interlayer insulation films 5 made of the Low-K material having low strength in the multilayer wiring layer 3 of the semiconductor element 10 is eased so that destruction such as the delamination is prevented.

However, in these embodiments, as the cooling rate is decreased more, the time for cooling becomes longer so that the manufacturing cost of the semiconductor device may be increased.

Accordingly, in the third embodiment of the present invention, the cooling rate is changed in a phased manner, namely in a step manner, so that time for the cooling process is shortened without drastic temperature change. Since a drastic temperature change is not generated, stress applied to the wiring layers 4 stacked via the interlayer insulation films 5 made of the Low-K material of the semiconductor element 10 is eased so that destruction such as the delamination is prevented and it is possible to prevent the cooling time from being long.

More specifically, during the cooling process after the reflow heating process, the temperature is maintained at the designated temperature for a specified time and then decreased again. In the cooling process, this step method is implemented at least one time so that the semiconductor device is cooled to approximately 50° C.

Figure 7:
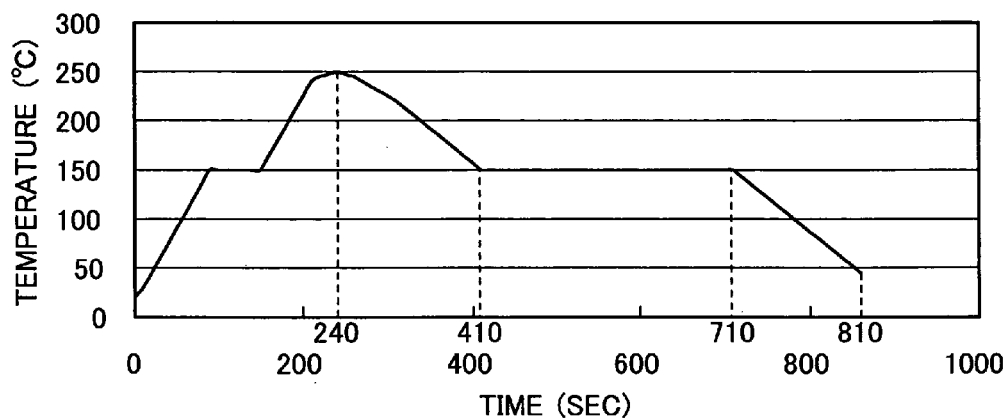
FIG. 7 is a graph showing temperature change of the semiconductor device shown in FIG. 3 in a reflow heating process and a cooling process (first step-cooling process) after the reflow heating process.

FIG. 7 is a graph showing temperature change of the semiconductor device shown in FIG. 3 in a reflow heating process for connecting the outside connection projection electrode 9 of the semiconductor element 10 and the wiring board 20, and a cooling process (first step-cooling process) after the reflow heating process. The horizontal axis of this graph indicates time (sec) and the vertical axis of this graph indicates temperature (° C.).

In other words, in the reflow heating process, a temperature of approximately 150° C. is maintained for a designated time. Flux is activated and oxide films on surfaces of the outside connection projection terminals 9 and the preliminary solder are removed. After that, heating is applied until the temperature is greater than the melting point of the solder, such as 250° C.

When approximately 240 seconds pass after the reflow heating process starts, the temperature reaches approximately 250° C. At this time, the solder is molten. After the solder is molten, heating is stopped and the temperature is decreased to be equal to or lower than the melting point of the solder (217 through 220° C.) and thereby the solder is made solid. After the solder is solidified, cooling is applied from the melting point of the solder to a temperature near normal temperature.

In the third embodiment of the present invention, approximately 0.7° C./s is applied as the cooling rate. When approximately 410 seconds pass after the reflow heating process starts the temperature reaches approximately 150° C., then the temperature is maintained at approximately 150° C. for approximately 300 second.

After that, cooling is implemented at approximately 0.7° C./s until the temperature reaches approximately 50° C.

As a result of this, as shown in FIG. 7, when approximately 810 seconds pass after the reflow heating process starts, the temperature reaches approximately 50° C.

After the temperature reaches approximately 50° C., the semiconductor element 10 connected to the wiring board 20 is taken outside of the reflow processing apparatus so as to be self-cooled (naturally cooled).

After that, the underfill material 23 is supplied between the semiconductor element 10 and the wiring board 20 and then cured. Last, solder balls are provided on a lower surface of the wiring board 20 so that outside connection projection electrodes 24 are connected.

Fourth Embodiment of the Present Invention

In the fourth embodiment, as well as the third embodiment, of the present invention, during the cooling process after the reflow heating process, the temperature is maintained at the designated temperature for a specified time and then decreased again. In the cooling process, this is implemented at least one time so that the semiconductor device is cooled to approximately 50° C.

Figure 8:
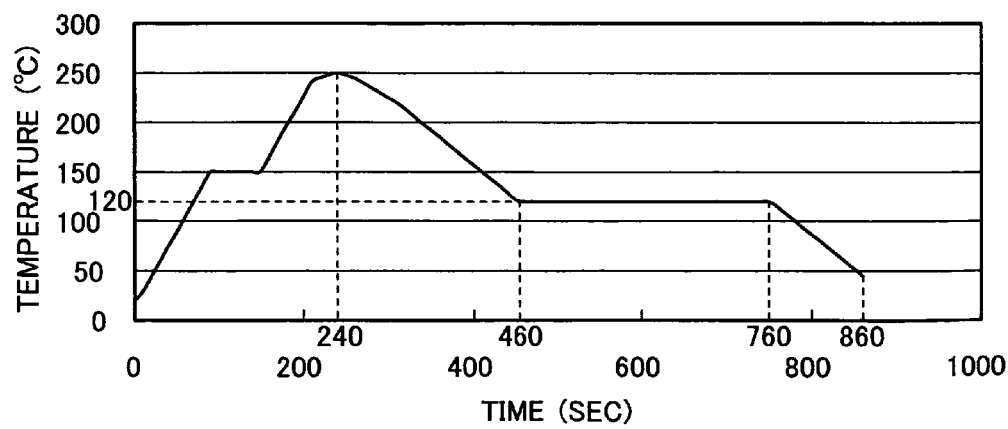
FIG. 8 is a graph showing temperature change of the semiconductor device shown in FIG. 3 in a reflow heating process and a cooling process (second step-cooling process) after the reflow heating process.

FIG. 8 is a graph showing temperature change of the semiconductor device shown in FIG. 3 in a reflow heating process for connecting the outside connection projection electrode 9 of the semiconductor element 10 and the wiring board 20 and a cooling process (second step-cooling process) after the reflow heating process. The horizontal axis of this graph indicates time (sec) and the vertical axis of this graph indicates temperature (° C.).

In other words, in the reflow heating process, a temperature of approximately 150° C. is maintained for a designated time. Flux is activated and oxide films on surfaces of the outside connection projection terminals 9 and the preliminary solder are removed. After that, heating is applied until the temperature is greater than the melting point of the solder, such as 250° C.

When approximately 240 seconds pass after the reflow heating process starts, the temperature reaches approximately 250° C. At this time, the solder is molten. After the solder is molten, heating is stopped and the temperature is decreased to be equal to or lower than the melting point of the solder (217 through 220° C.) and thereby the solder is made solid. After the solder is solidified, cooling is applied from the melting point of the solder to a temperature near normal temperature.

In the fourth embodiment of the present invention, approximately 0.7° C./s is applied as the cooling rate. When approximately 460 seconds pass after the reflow heating process start the temperature reaches approximately 120° C., then the temperature is maintained at approximately 120° C. for approximately 300 second.

After that, cooling is implemented at approximately 0.7° C./s until the temperature reached approximately 50° C.

As a result of this, as shown in FIG. 8, when approximately 860 seconds pass after the reflow heating process starts, the temperature reaches approximately 50° C.

After the temperature reaches approximately 50° C., the semiconductor element 10 connected to the wiring board 20 is taken outside of a reflow processing apparatus so as to be self-cooled (naturally cooled).

After that, the underfill material 23 is supplied between the semiconductor element 10 and the wiring board 20 and then cured. Last, solder balls are provided on a lower surface of the wiring board 20 so that outside connection projection electrodes 24 are connected.

In the third and fourth embodiments shown in FIG. 7 and FIG. 8, maintaining a designated temperature (approximately 150° C. in the third embodiment shown in FIG. 7 or approximately 120° C. in the fourth embodiment shown in FIG. 8) is implemented in the reflow processing apparatus. However, the present invention is not limited to this example.

For example, after the temperature reaches such a designated temperature (approximately 150° C. in the third embodiment shown in FIG. 7 or approximately 120° C. in the fourth embodiment shown in FIG. 8), the semiconductor element 10 and the wiring board 20 may be moved from the reflow processing apparatus to a constant temperature chamber so that the temperature may be maintained at the designated temperature in the constant temperature chamber.

In this case, after the temperature reaches approximately 50° C., the semiconductor element 10 connected to the wiring board 20 is taken outside of the constant temperature chamber so as to be self-cooled (naturally cooled).

The inventors of the present invention checked the multilayer wiring layer 3 of the semiconductor element 10 of the semiconductor device manufactured by the above-discussed embodiments of the present invention. The inventors found that there is no delamination at the wiring layers 4 stacked via the interlayer insulation films 5 made of the Low-K material.

The inventors also implemented a temperature shock test of 100 cycles as an environmental test, a moisture absorption test, and reflow tests three times under conditions defined by JEDEC (Joint Electron Device Engineering Council)-Level 3. As a result of this, it is found by the inventors that destruction such as delamination due to application of the stress to the wiring layers 4 stacked via the interlayer insulation films made of the Low-K material does not occur.

Generally, constant strain is created by action of stress and the stress is eased by creep phenomenon if this strain is maintained.

In this example, considering such a creep phenomenon, a designated temperature is maintained for a designated time in the cooling process after the reflow heating process so that the stress is eased. After that the temperature is decreased again so that the cooling rate is changed in a step manner.

Therefore, the solder can follow contraction or deformation of the semiconductor element 10 and the wiring board 20 accompanying the cooling process so that the stress applied from the wiring board to the semiconductor element can be absorbed. Therefore, stress applied from the wiring board 20 to the wiring layers 4 stacked via the interlayer insulation films 5 made of the Low-K material of the semiconductor element 10 is eased so that destruction such as the delamination is prevented.

In addition, while the cooling time may be long so that the manufacturing cost is increased by making the cooling rate low in the first or second embodiment of the present invention, it is not necessary to make the cooling rate slow so that the processing time can be shortened in the third embodiment of the present invention.

It is preferable to set temperature in a range of approximately 80 through 150° C. as the designated temperature to be maintained.

The inventors of the present invention found that, if the temperature to be maintained is lower than approximately 80° C., the stress is applied to the wiring layers 4 stacked via the interlayer insulation films 5 at the time when the designated temperature is maintained and therefore the delamination occurs.

In addition, if the temperature to be maintained is higher than approximately 150° C., even if delamination is prevented when the temperature is higher than approximately 150° C., the solder is deformed again due to cooling and the stress applied from the wring board 20 to the semiconductor element 10 cannot be absorbed. Therefore, the delamination cannot be prevented. Thus, as a result of this, it is necessary to change the cooling rate in a step manner when the temperature is equal to or lower than approximately 150° C.

Hence, it is preferable to set a temperature in the range of approximately 80 through 150° C. as the designated temperature to be maintained.

In addition, it is preferable that the time for maintaining the designated temperature be equal to or greater than approximately 120 seconds.

If the time for maintaining the designated temperature is shorter than approximately 120 seconds, cooling progresses before the stress is eased based on the creep phenomenon and thereby the solder cannot absorb the stress applied from the wiring board 20 to the semiconductor element 10 and the delamination cannot be prevented.

On the other hand, if the time for maintaining the designated temperature is equal to or greater than approximately 120 seconds, the stress applied from the wiring board 20 to the semiconductor element 10 can be sufficiently eased. Therefore, the solder follows contraction or deformation of the semiconductor element 10 or the wiring board 20 accompanying cooling, so that the stress applied from the wiring board 20 to the semiconductor element 10 can be absorbed. Therefore, stress applied from the wiring board 20 to the wiring layers 4 stacked via the interlayer insulation films 5 made of the Low-K material of the semiconductor element 10 is eased so that destruction such as the delamination can be prevented.

Accordingly, from the view point of preventing destruction such as the delamination, it is preferable that the time for maintaining the designated temperature be longer. However, if the time for maintaining at the designated temperature is too long, process time becomes longer so that the manufacturing cost may be increased. Hence, an upper limit of the time for maintaining the temperature is set based on an upper limit of processing time.

The number of steps for maintaining the designated temperature for a designated time and then decreasing the temperature again is not limited to one in this example but may be plural times. From the view point of preventing destruction such as the delamination, it is preferable that the number of the steps be more. However, if the number of the steps is too many, the process time becomes longer so that the manufacturing cost may be increased. Hence, an upper limit of the number of the steps is set based on an upper limit of processing time.

Thus, in the third or fourth embodiment of the present invention, the cooling rate is changed in a step manner. As a result of this, in the third or fourth embodiment, as well as the first or second embodiment of the present invention, stress applied from the wiring board 20 to the wiring layers 4 stacked via the interlayer insulation films 5 made of the Low-K material of the semiconductor element 10 is eased so that destruction such as the delamination can be prevented. In addition, the processing time can be shortened.

Thus, as discussed above, according to the embodiments of the present invention, when the semiconductor element is mounted on a wiring board via an outside connection projection terminal not containing lead (Pb), stress applied from the wiring board to a multilayer wiring part of the semiconductor element including an interlayer insulation film formed by a Low-K material can be eased, so that delamination can be prevented.

In addition, according to the embodiments of the present invention, an inexpensive organic buildup board can be used as the wiring board. Therefore, it is possible to save on manufacturing costs.

Furthermore, according to the embodiments of the present invention, in order to prevent the above-mentioned delamination when the semiconductor element is mounted on the wiring board, it is not necessary to apply specific structures to the semiconductor element and the wring board and not necessary to use a special mounting device. Therefore, delamination in the semiconductor element at the time when the semiconductor element is mounted on the wiring board can be easily prevented.

The present invention is not limited to these embodiments, but variations and modifications may be made without departing from the scope of the present invention.

This patent application is based on Japanese Priority Patent Application No. 2006-223280 filed on Aug. 18, 2006, the entire contents of which are hereby incorporated by reference.

What is claimed is:

1. A mounting method of a semiconductor element whereby the semiconductor element is mounted on a wiring board via an outside connection projection electrode not containing lead (Pb), the mounting method comprising:

applying a reflow heating process for connecting the outside connection projection electrode of the semiconductor element and the wiring board until a material forming the outside connection projection electrode is molten;

cooling the semiconductor element and the wiring board so that a temperature thereof becomes equal to or lower than a melting point of the material forming the outside connection projection electrode and the material forming the outside connection projection electrode becomes solidified; and after the material forming the outside connection projection electrode is solidified, gradually cooling the connected semiconductor element and wiring board at a cooling rate equal to or lower than 0.5° C./s for hundreds of seconds until the temperature thereof becomes near normal room temperature.

2. The mounting method of the semiconductor element as claimed in claim 1,
wherein the cooling rate is approximately 0.5° C./s.

3. The mounting method of the semiconductor element as claimed in claim 1,
wherein the outside connection projection electrode is made of solder not containing lead (Pb).

4. The mounting method of the semiconductor element as claimed in claim 1,
wherein the wiring board is made of an organic material.

5. The mounting method of the semiconductor element as claimed in claim 4,
wherein the semiconductor element includes a multilayer wiring structure where wiring layers are stacked via interlayer insulation films made of a material having a low dielectric constant.

6. A manufacturing method of a semiconductor device, comprising:

applying a reflow heating process for connecting the outside connection projection electrode of the semiconductor element and the wiring board until a material forming the outside connection projection electrode is molten;

cooling the semiconductor element and the wiring board so that a temperature thereof becomes equal to or lower than a melting point of the material forming the outside connection projection electrode and the material forming the outside connection projection electrode is solidified; and after the material forming the outside connection projection electrode is solidified, gradually cooling the connected semiconductor element and wiring board at a cooling rate equal to or lower than 0.5° C./s for hundreds of seconds until the temperature thereof becomes near normal room temperature.

* * * * *